US006974953B2

(12) United States Patent
Iida et al.

(10) Patent No.: US 6,974,953 B2
(45) Date of Patent: Dec. 13, 2005

(54) INFRARED SENSOR DEVICE AND MANUFACTURING METHOD THEREOF

(75) Inventors: Yoshinori Iida, Tokyo (JP); Keitaro Shigenaka, Tokyo (JP); Naoya Mashio, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/960,988

(22) Filed: Oct. 12, 2004

(65) Prior Publication Data

US 2005/0061980 A1 Mar. 24, 2005

Related U.S. Application Data

(62) Division of application No. 10/108,391, filed on Mar. 29, 2002, now Pat. No. 6,806,470.

(30) Foreign Application Priority Data

Mar. 30, 2001 (JP) ............................ 2001-100402

(51) Int. Cl.[7] ................................................ G01J 5/20
(52) U.S. Cl. .................................... 250/338.1; 257/250
(58) Field of Search .......................... 250/338.1, 338.3, 250/339.01, 339.02, 339.04, 330, 332, 340; 374/129, 121, 133, 170; 257/250, 227, 412, 257/413, 431, 467; 340/580, 581, 584

(56) References Cited

U.S. PATENT DOCUMENTS 5,962,854 A 10/1999 Endo
6,048,092 A 4/2000 Kimura et al.
6,222,454 B1 4/2001 Harling et al.
6,335,478 B1 1/2002 Chou et al.
6,483,111 B1 11/2002 Ishikawa et al.
6,548,879 B2 4/2003 Komobuchi et al.
6,603,160 B1 8/2003 Zhang
6,608,356 B1 8/2003 Kohyama et al.
2002/0009821 A1 1/2002 Moor et al.

FOREIGN PATENT DOCUMENTS

JP 8-285680 1/1996
JP 2000-88640 3/2000

OTHER PUBLICATIONS

T. Ishikawa, et al., Part of the SPIE Conference on Infrared Technology and Applications XXV, vol. 3698, pp. 556-564, "Low-Cost 320×240 Uncooled IRFPA Using Conventional Silicon IC Process", Apr. 1999.

A. Yagishita, et al., IEEE Transactions on Electron Devices, vol. 47, No. 5, pp. 1028-1034, "High Performance Damascene Metal Gate Mosfet's for 0.1 $\mu$m Regime", May 2000.

*Primary Examiner*—Otilia Gabor
(74) *Attorney, Agent, or Firm*—Oblon, Spivak, McClelland, Maier & Neustadt, P.C.

(57) ABSTRACT

A supporting beam line for supporting, afloat in a cavity on a semiconductor substrate, an infrared detection pixel comprising an infrared absorption portion for absorbing an incident infrared ray and converting it into heat and a thermoelectric conversion portion for converting a temperature change caused by the heat generated in the infrared absorption portion into an electric signal is formed by a damascene metal on the same layer as the gate of a damascene metal gate MOS transistor to be used in a peripheral circuit. The supporting beam line comprises a conductor line with U-shaped cross section inside which a metal is filled.

9 Claims, 12 Drawing Sheets

INFRARED SENSOR DEVICE AND MANUFACTURING METHOD THEREOF

CROSS-REFERENCE TO RELATED APPLICATIONS

This application is a divisional of U.S. application Ser. No. 10/108,391, filed Mar. 29, 2002, now U.S. Pat. No. 6,806,470, and is based upon and claims the benefits of priority from the prior Japanese Patent Application No. 2001-100402, filed on Mar. 30, 2001; the entire contents of each are incorporated herein by reference.

BACKGROUND OF THE INVENTION

1. Field of the Invention

The present invention relates to an infrared sensor and a manufacturing method thereof and, in particular, to a pixel construction of an uncooled infrared sensor and a manufacturing method thereof.

2. Related Art

Infrared image sensing is characterized in its ability to pick up images at night as well as during the daytime and its higher transmittance to smoke and fog than visible radiation. Being capable of acquiring temperature information of an object to be sensed, infrared image sensors are adaptable to a variety of applications, such as a monitor camera and a fire detection camera, besides the field of defense.

In recent years, extensive studies have been made on "uncooled infrared solid-state imaging elements" which eliminate the need for the cooling mechanism to allow for a low-temperature operation, which is the most critical shortcoming of a quantum type infrared solid-state imaging element or a leading conventional type. In such an uncooled infrared solid-state imaging device, an incident infrared ray having a wavelength of 10 μm or so is converted into heat by an absorber and then the temperature change caused by this small amount of heat at a heat sensing portion is converted into an electric signal by thermoelectric conversion means of any kind, before reading out the electric signal to obtain infrared image information.

There are three ways of improving the sensitivity of such an uncooled infrared sensor, generally classified as follows:

The first method is to improve the ratio of an infrared power incident to an infrared detection portion, dP, to a temperature change of an object, dTs, namely dP/dTs. This method achieves improvement mainly by optical systems, which corresponds to enlargement of an infrared lens aperture, application of an antireflective coating, use of a lens material of low optical absorption, increase of an infrared absorptivity at an infrared detection portion or increase of an infrared absorption area. In accordance with the recent multiplication of pixels for an uncooled infrared sensor, the size of a unit pixel has mainly come to as small as 40 μm×40 μm and, among the items mentioned above, the increase of an infrared absorption area at an infrared detection portion has remained a relatively critical problem to be solved. However, a report has been published that an infrared absorption area can be increased up to 90% of a pixel area by stacking an infrared absorption layer on top of the pixel (Tomohiro Ishikawa, et al., Proc. SPIE Vol. 3698, p. 556, 1999) and it is difficult to obtain a further considerable amount of improvement in sensitivity by any optical means.

The second method is to improve the ratio of a temperature change at an infrared detection portion, dTd, to an incident infrared power, dP, namely dTd/dP. Whereas the aforementioned method is an optical one, this can be said to be thermal. Generally speaking, in an uncooled infrared sensor to be packed in a vacuum package, transportation of heat from an infrared detection portion to a supporting substrate is predominantly accomplished by heat conduction by a supporting structure which supports the infrared detection portion in a cavity within the supporting substrate. Thus, attempts have been made to lay a leg-like supporting structure made of a material of low thermal conductivity as narrowly and longways as possible within the constraint of the design. See Tomohiro Ishikawa, et al., Proc. SPIE Vol. 3698, p. 556, 1999, for example. As shown in FIGS. 14(*a*) and 14B, a construction has been made such that a pair of narrow, spiral slits 201 is formed around a pixel 200 to form a cavity 204 at the bottom of the element. These spiral channels 202 are used as a supporting structure to support the pixel 200 afloat and wirings 203 are provided to connect to a peripheral circuit. When a pixel is being miniaturized to as small as 40 μm×40 μm or so, however, since fine processing has already been made at the silicon LSI processing level, a considerable degree of further improvement in sensitivity may hardly be realized through refinement of the layout of the supporting structure. Similarly, it is difficult to further reduce the thermal conductivity which is a material characteristic of the supporting structure. In particular, with regard to the wiring for outputting electric signals from the infrared detection portion, it is difficult to realize a considerable amount of improvement in sensitivity in terms of material since there is a requirement contradictory between the electric conduction and heat conduction whose mechanisms are similar.

The third method is to improve the ratio of an electric signal change caused by thermoelectric conversion means, dS, to a temperature change at an infrared detection portion, dTd, namely dS/dTd and is, therefore, electrical in nature. This method is, unlike the other two, is directed to sheer sensitization, that is, improvement of dS/dTd; however, it is quite important to reduce various electric noises generated. Thus, various kinds of thermoelectric conversion means have so far been investigated. Reported are, for example, a thermopile for converting a temperature change into a potential change by means of Seebeck effect (Toshio Kanno, et al., Proc. SPIE Vol. 2269, pp. 450–459, 1994), a bolometer for converting a temperature change into a resistance change by means of the temperature change of a resistor (A. Wood, Proc. IEDM, pp. 175–177, 1993), a pyroelectric element for converting a temperature change into an electric charge by pyroelectric effect (Charles Hanson, et al., Proc. SPIE Vol. 2020, pp. 330–339, 1993), a silicon pn junction for converting a temperature change into a voltage change by certain forward currents (Tomohiro Ishikawa, et al., Proc. SPIE Vol. 3698, p. 556, 1999), etc.

If a comparison is made among those methods, however, no one method is then decisively superior to the others in comprehensive view of their thermoelectric conversion characteristics, noise characteristics and manufacturing methods. For instance, the bolometer is superior in terms of temperature resolution while the silicon pn junction, which can be manufactured by the silicon LSI processing alone, is superior in terms of manufacturing method.

As described above, one of the methods for sensitizing an uncooled infrared sensor is a secondly mentioned thermal one, which improves the ratio of a temperature change at an infrared detection portion, dTd, to an incident infrared power, dP, namely dTd/dP. Generally speaking, transportation of heat from an infrared detection portion to a supporting substrate is predominantly accomplished by heat conduction through a supporting structure which supports the infrared detection portion in a cavity within the supporting substrate. Thus, attempts have been made to lay a leg-like supporting structure made of a material of low thermal conductivity as narrowly and longways as possible within the constraint of the design. When a pixel is being miniaturized to as small as 40 μm×40 μm or so, however, since fine processing has already been made at the silicon LSI processing level, a considerable degree of further improvement in sensitivity may hardly be realized through refinement of the layout of the supporting structure.

Furthermore, with a trend of miniaturizing pixels and supporting structures involved in the development of fine processing technology in silicon LSI processing, the influence of the heat transportation by emission from the bottom of a pixel and supporting structure will predictably be appreciable and the sensitization only through the reduction of heat conduction by the miniaturization of a supporting structure will predictably be restricted by a limit in sensitivity contributable to such emission.

In addition, in order to read signals out from an infrared detection portion, a supporting beam line to be formed within a supporting structure must be provided with a unique wiring layer made of a low thermal conductivity material. For example, a supporting beam line structure using titanium material is known to be effective.

Except for the case where titanium itself is used as a thermoelectric conversion material, however, in addition to the wiring process at an element peripheral circuit, another process will be required for forming a supporting beam line structure alone.

SUMMARY OF THE INVENTION

The present invention is directed to improve the above supporting structure and to provide a highly sensitized infrared sensor and a manufacturing method thereof.

According to one aspect of the present invention, provided is an infrared sensor device comprising:

a semiconductor substrate having a principal plane including a surface portion in which a hole is provided;

an infrared detection pixel disposed in the hole, comprising an infrared absorption portion configured to absorb an infrared ray and convert it into heat and a thermoelectric conversion portion configured to convert the heat into an electric signal;

a semiconductor peripheral circuit, disposed on the principal plane of the substrate, configured to read out the electric signal from the infrared detection pixel; and a supporting beam line with U-shaped cross section, extending across the infrared detection pixel and the surface portion having the hole, configured to support the infrared detection pixel, afloat within the hole and to electrically connect the infrared detection pixel to the semiconductor peripheral circuit.

According to another aspect of the present invention, also provided is an infrared sensor device comprising:

a semiconductor substrate having a principal plane including a plurality of surface portions in each of which a hole is provided;

a plurality of infrared detection pixels each disposed in the hole, each comprising an infrared absorption portion, configured to absorb an infrared ray and to convert it into heat and a thermoelectric conversion portion configured to convert the heat into an electric signal;

a semiconductor peripheral circuit, disposed on the principal plane of the substrate, configured to read out the electric signals from the infrared detection pixels, the semiconductor peripheral circuit including at least a MOS transistor having a gate comprising a first electric conductor with U-shaped cross section along the directions of the source and drain and a metal filled within the electric conductor; and a plurality of supporting beam lines, each extending across the infrared detection pixel and the surface portion having the hole, configured to support the infrared detection pixel, afloat within the hole and configured to electrically connect the infrared detection pixels to the semiconductor peripheral circuit, each of the supporting beam lines including at least a second electric conductor with U-shaped cross section and being formed in the same layer as the first electric conductor with U-shaped cross section of the gate of the MOS transistor.

According to still another aspect of the present invention, further provided is an infrared sensor device comprising:

a semiconductor substrate having a semiconductor supporting substrate and a semiconductor layer and an insulating layer interposed therebetween, in which a plurality of holes are provided on the semiconductor substrate, the holes penetrating the semiconductor layer and the insulating layer to reach the semiconductor supporting substrate;

a plurality of infrared detection pixels each disposed in each of the holes, each comprising an infrared absorption portion configured to absorb an infrared ray and to convert it into heat and a thermoelectric conversion portion configured to convert the heat into an electric signal;

a semiconductor peripheral circuit, formed on the semiconductor layer, including at least a MOS transistor having a damascene metal gate formed for driving the infrared detection pixels to read out the electric signal; and damascene metal supporting beam lines, extending across the infrared detection pixels and side surfaces of the holes of the semiconductor substrate respectively, configured to support the infrared detection pixel, afloat within the holes respectively and to electrically connect the infrared detection pixels to the semiconductor peripheral circuit respectively, the damascene metal supporting beam lines being disposed in the same layer as the damascene metal gate.

The U-shaped electric conductor may have a shape of a square having one side thereof open, a circle or oval having a segment thereof open or a parabola.

By forming the supporting beam line across the infrared detection pixel and the substrate on the same layer as the damascene metal gate of the MOS transistor of the peripheral circuit, the beam line with U-shaped cross section may be rigid and elaborate, thereby considerably reducing the cross section of the supporting beam line.

It is therefore possible to considerably reduce the heat conduction through the supporting beam line, which predominates the heat transportation between the infrared detection pixel and the substrate, consequently providing a highly sensitive uncooled infrared sensor device.

According to another aspect of the present invention, provided is a method of manufacturing an infrared sensor, comprising:

embedding a silicon oxide layer in a substrate comprising a single crystalline silicon supporting substrate, an silicon oxide film layer formed on the single crystalline silicon supporting substrate and a single crystalline silicon layer formed on the silicon oxide film layer, over a predetermined region of the single crystalline silicon layer;

forming a thermoelectric converter pn junction for an infrared detection pixel in the single crystalline silicon layer;

forming a supporting beam line including a U-shaped electric conductor on the silicon oxide layer while forming a gate electrode of a MOS transistor having an electric conductor with U-shaped cross section, the MOS transistor being included in a peripheral circuit on the single crystalline silicon layer;

forming an infrared absorption layer on the single crystalline silicon layer; and forming a hole by etching for isolating the infrared detection pixel of the substrate from the substrate and suspending the infrared detection pixel within the hole by the supporting beam line.

By forming the supporting beam line with a minimum cross section through the step of etching the hole for isolating the periphery of the infrared detection pixel from the substrate, the length of the supporting beam line may considerably be lessened and the aperture ratio, defined as an infrared detection pixel area relative to a unit pixel area, may considerably be improved. In addition, lessening the length of the supporting beam line may increase the mechanical strength and stabilize the operation while enabling sensitization to an infrared ray. Furthermore, linearization of the supporting beam line may extremely stabilize the manufacturing method thereof and, in turn, improvement of the yield may lower the cost.

At the same time, according to the present invention, the chip area may be reduced by miniaturizing the peripheral circuit and, therefore, the cost may naturally be lowered.

As described above, according to the present invention, an inexpensive and highly sensitive uncooled infrared sensor may be obtained.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
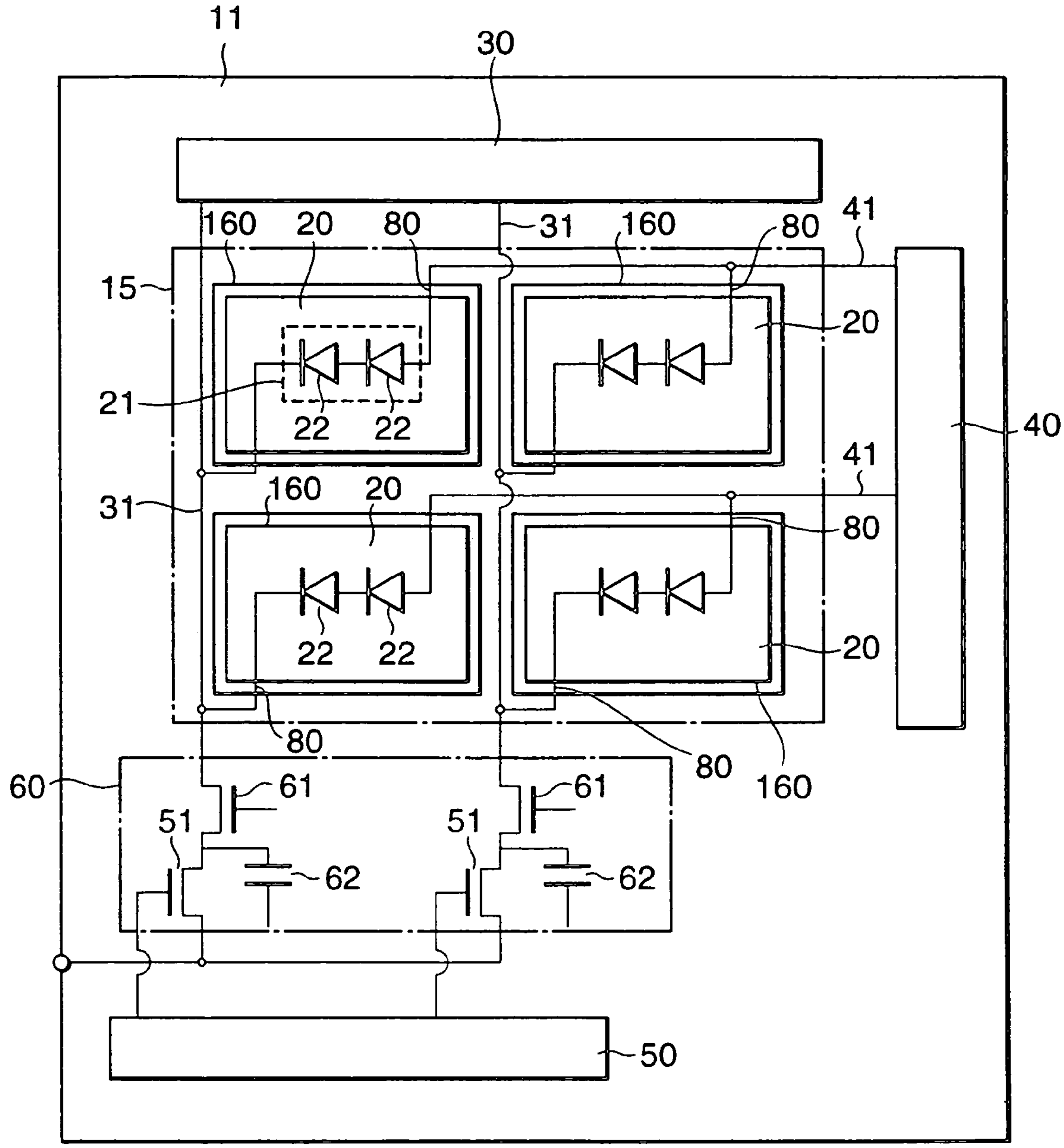
FIG. 1 is a circuit diagram of an infrared sensor according to a first embodiment of the present invention.

Various embodiments of the present invention will hereinbelow be described in more detail with reference to the accompanying drawings.

FIGS. 1 through 4 represent an infrared sensor according to a first embodiment of the present invention.

In the drawings, a semiconductor substrate 11 is composed of a single crystalline silicon semiconductor supporting substrate 12, an embedded silicon oxide insulating layer 13 provided on the substrate 12 and a single crystalline silicon semiconductor layer (SOI) layer 14. Such a substrate construction is called a silicon-on-insulator (SOI) construction.

Partitioned on the substrate 11 is an infrared detection region 15, within which multiple holes 16 and cavities 160 are arranged in a lattice. Each cavity 160 is reversed pyramid in shape and the hole 16 is open on the side of the SOI layer 14 of the substrate 11, thus penetrating the SOI layer 14 and the insulating layer 13 down to the semiconductor supporting substrate 12 and having its bottom surface the supporting substrate.

Infrared detection pixels 20 are disposed within the cavity 160 to be arranged into a matrix of two rows by two columns on the infrared detection region 15. In this embodiment, description will be made with regard to four pixels for the purpose of illustration; however, as many pixels as needed according to the desired resolution may practically be disposed in order to sense an infrared image.

On the substrate 11, a constant current source 30, a vertical addressing circuit 40, a horizontal addressing circuit 50 and a column sample and hold circuit 60 are integrated to form a semiconductor peripheral circuit.

Each infrared detection pixel 20 comprises a thermoelectric conversion portion 21 in which multiple, two in the drawings, pn junctions 22 are connected in series in the SOI layer 14 and an infrared absorption layer 23, laminated on the substrate, composed of a silicon oxide layer 24 and a silicon nitride layer 25. Sandwiched between the thermoelectric conversion portion 21 and the infrared absorption layer 23 is a wiring portion 26, which is laid on a wiring insulating layer 27 to contact with the n and p regions of the SOI layer 14 to form a wiring circuit.

The infrared detection pixel 20 is suspended afloat in the hole 16 and the cavity 160 by a supporting beam line 80 and the sidewall 28 of the infrared detection pixel 20 is isolated by a gap from the surface 18 of the substrate forming the hole.

The peripheral circuit is formed on the SOI layer 14 of the semiconductor substrate 11 and at least some transistors and capacitors comprising the circuit are of MOS type.

Figure 2:
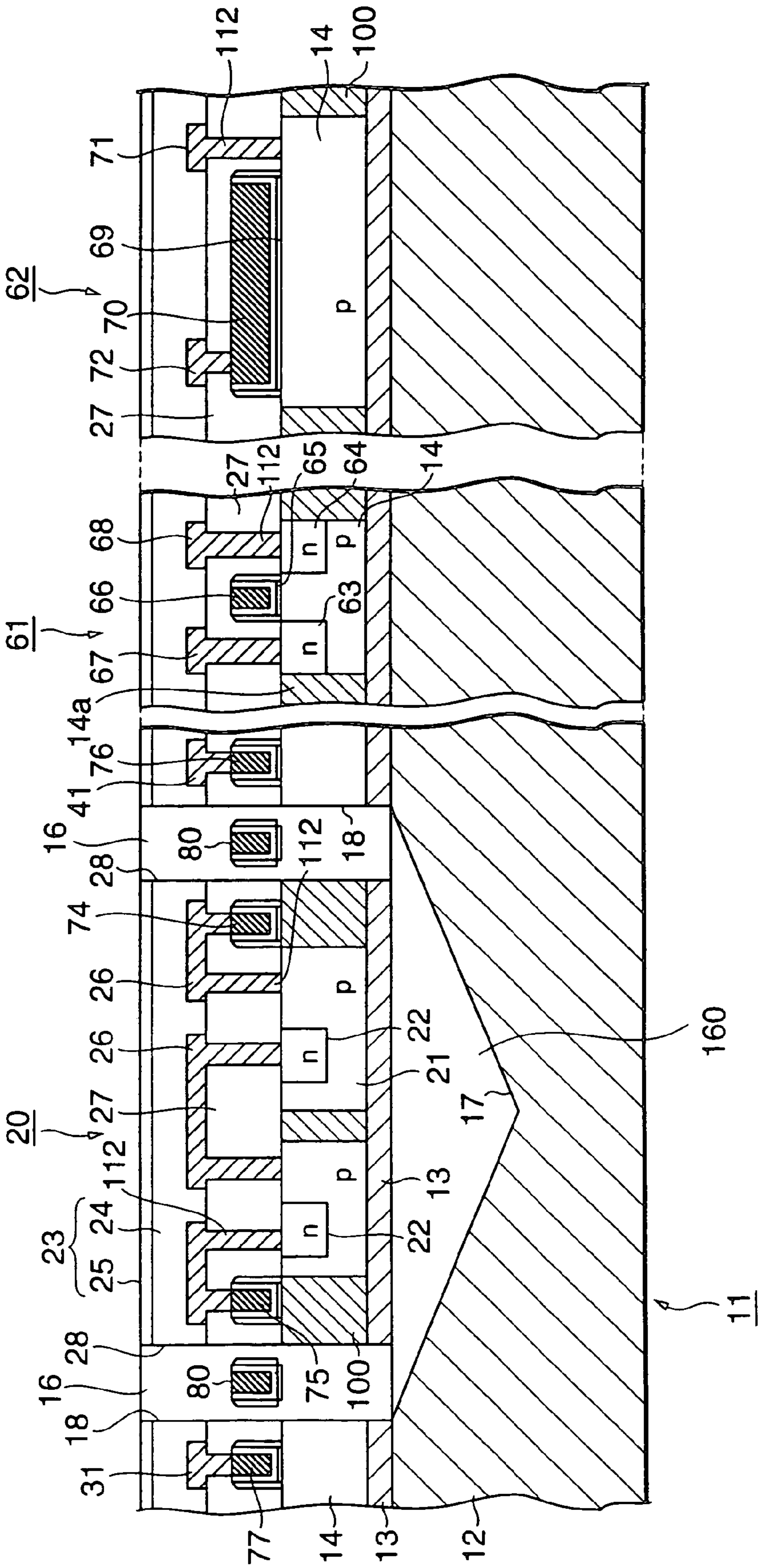
FIG. 2 is a sectional view across various portions according to the first embodiment of the present invention.

FIG. 2 further shows a sampling MOS type transistor 61 of the column sample and hold circuit 60 and a MOS capacitor 62. The MOS transistor 61 forms n-type source and drain regions 63 and 64 on the p-type SOI layer 14 and also forms a channel region under the gate insulating film 65 formed on the surface 14*a* of the SOI layer 14. The gate is constructed so that it comprises a conducting layer with U-shaped cross section in the direction from the source to the drain (channel direction), inside which a metal core is filled. This gate electrode 66 is typically called a damascene metal gate. The surface of the SOI layer 14 is coated with a wiring insulating layer 27 of silicon oxide and electrodes 67 and 68 are disposed via a plug 112 of the contact hole.

The MOS capacitor 62 is made by forming a silicon oxide insulating layer 69 on the p-type SOI layer 14 according to the same procedure as the gate insulation film 65 and sandwiching the layer 69 with the same conducting layer 70 as the damascene metal gate of the MOS transistor 61. Electrodes 71 and 72 are lead out from the p-type layer 14 and the conducting layer 70 via the plug 112 to be connected to the circuit wiring.

The damascene metal gate electrode 66 of the MOS transistor 61, the supporting beam line 80 and the MOS capacitor 62 can be fabricated on the surface of the SOI layer 14 according to the same damascene metal process and, therefore, disposed on the same layer.

Figure 4:
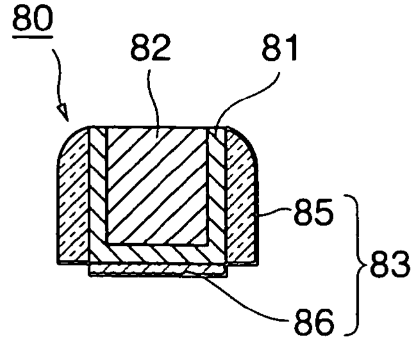
FIG. 4 is an enlarged sectional view of a supporting beam line according to the first embodiment of the present invention.

As shown in FIG. 4, enlarged in its cross section, the supporting beam line 80 comprises a conductor line with U-shaped cross section 81 and a metal 82 filled within the line. The conductor line 81 is in turn formed by a silicon nitride insulating layer 85 on either side and a silicon oxide insulating layer 86 at the bottom, together forming an outer insulating layer 83. The U-shaped conducting layer 81 is formed of an electric conductor such as titanium nitride.

This construction is the same as the damascene metal gate construction of the MOS transistor, the U-shaped conductor line 81, the metal-filled core 82, the insulating layer 85 on either side and the insulating layer 86 at the bottom corresponding to the barrier metal, the damascene metal, the sidesurface and the gate insulating film, respectively.

Figure 3:
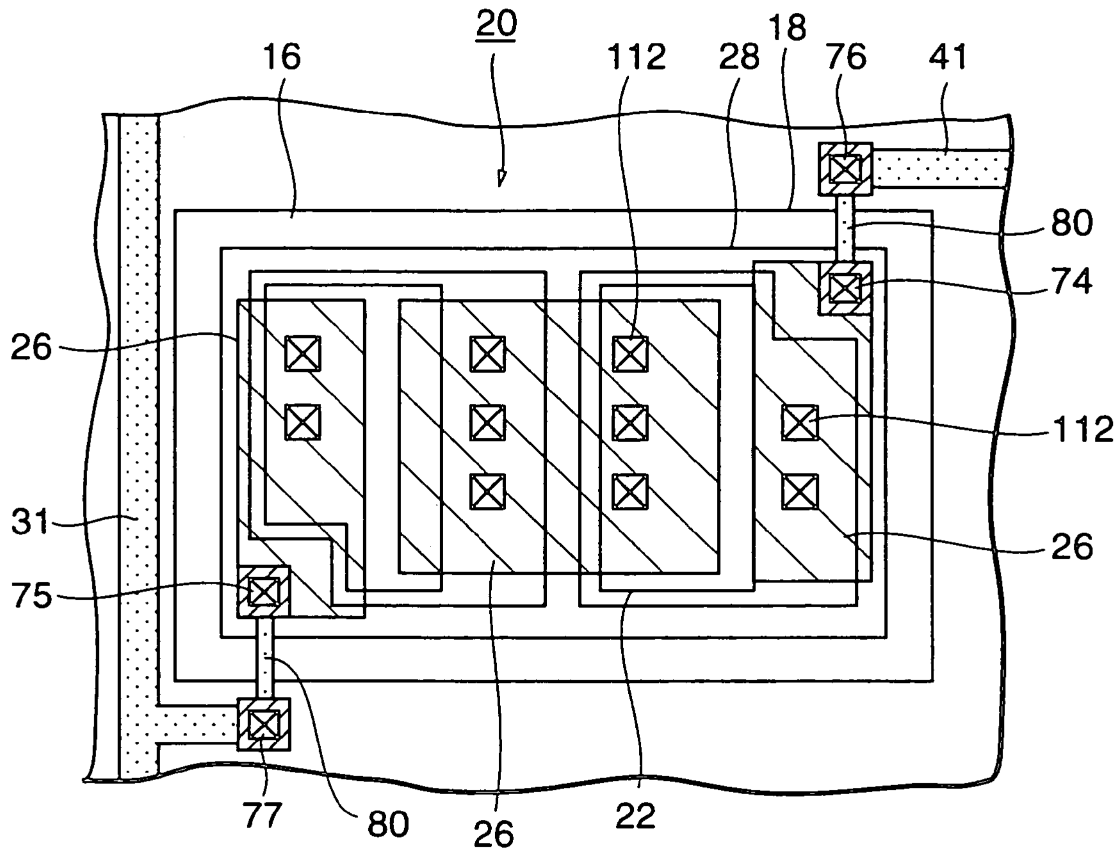
FIG. 3 is a plan view of an infrared detection pixel according to the first embodiment of the present invention.

As shown in FIG. 3, such a supporting beam line comes in a pair, one end of each of them being respectively electrically connected to a contact 74 and 75 of the wiring portion 26 of the infrared detection pixel 20 and the other end of each of them being respectively electrically connected to a contact 76 and 77 of the wirings 31 and 41 of the peripheral circuit.

As shown in FIG. 1, a row of the infrared detection pixel selected by the vertical addressing circuit 40 is applied with a forward bias current supplied by the constant current source 30 along the current path of the vertical signal line 31, the selected pixel 20 and the horizontal addressing line 41 and the signal voltage generated on the vertical signal line 31 is sampled and held by the column sample and hold circuit 60 and sequentially selected by the horizontal addressing circuit 50 for output.

FIG. 1 illustrates, as a simplest embodiment, an arrangement in which the signal voltage generated on the vertical signal line 31 is directly output via the column selecting transistor (composed of a damascene metal gate MOS transistor) 51 as sequentially selected by the horizontal addressing circuit 50. Since, however, this signal voltage is so weak that by providing an arrangement in which the signal voltage is read in parallel on row by row basis, sampled by the MOS transistor 61 at the previous stage and held for one horizontal period by means of the capacitor 62, the signal voltage can be read out while reducing noises by limiting the signal bandwidth.

As the infrared absorption layer 23, a silicon nitride layer 25 and then a silicon oxide layer 24 are formed from the surface. As shown in the infrared absorption characteristics in FIG. 5, infrared rays of 8 to 14 μm are absorbed and converted into heat by laminating these two absorbent materials.

Figure 5:
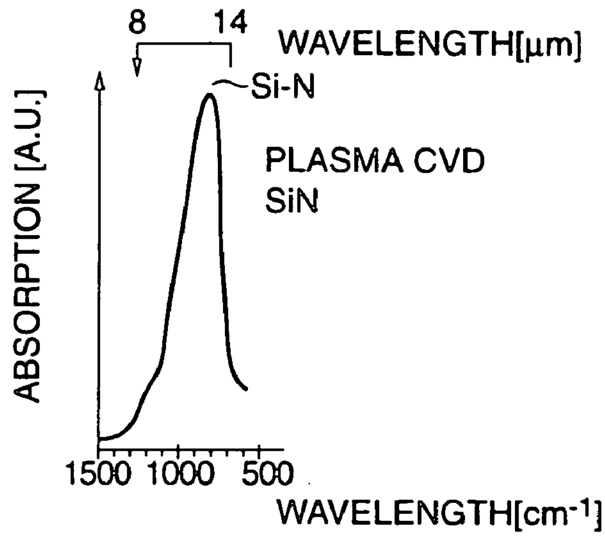
FIG. 5(*a*) represents infrared absorption characteristics of a CVD silicon nitride film, FIG. 5(*b*) represents infrared absorption characteristics of a CVD silicon oxide film and FIG. 5(*c*) represents absorption characteristics of a silicon oxide film produced by thermal oxidization, each at 10 $\mu$m band.
Figure 5:
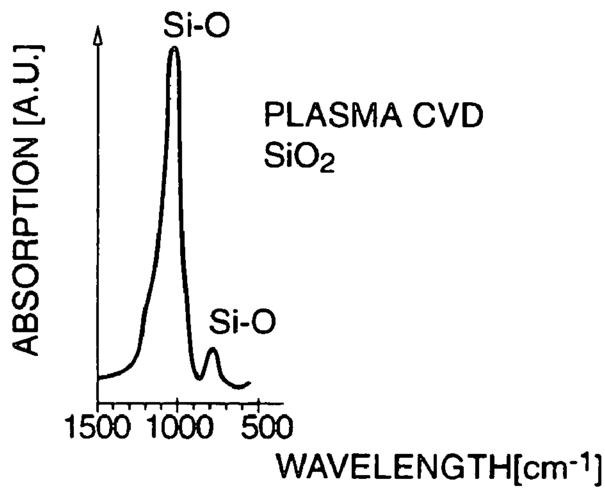
Figure 5:
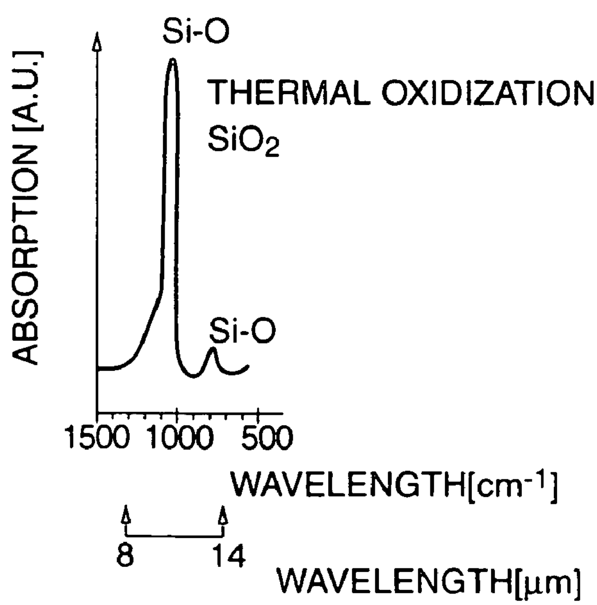

Specifically, FIG. 5(*a*) represents infrared absorption characteristics of a silicon nitride film (CVD), FIG. 5(*b*) represents infrared absorption characteristics of a CVD deposited silicon oxide film and FIG. 5(*c*) represents absorption characteristics of a heat-oxidized silicon oxide film, each at around 10 μm. As clearly seen from FIG. 5, the silicon nitride film 25 on the surface side has an absorption peak of Si—N bond at around 12 μm and the silicon oxide film 24 on the substrate side exhibits an absorption peak of Si—O bond at around 10 μm. By laminating these layers having different absorption peaks, therefore, incident infrared rays can efficiently be absorbed and converted into heat.

In addition, since the wiring portion 26 in the infrared detection pixel 20 in FIG. 3 is made of a metal such as aluminum and reflects incident infrared rays, it has an effect of increasing the absorption efficiency of infrared rays in the infrared absorption layer 23 in which such a wiring is embedded.

By providing the infrared detection pixel 20 and the supporting beam line 80 in the hole 16, the temperature of the pixel 20 is efficiently modulated by incident infrared rays. Specifically, as shown in FIG. 2, the infrared detection pixel 20 is supported afloat within the hole 16 and cavity 160 by the supporting beam line 80 so that the pixel wall 28 is isolated from the surface 18 of the hole and thermally isolated from the semiconductor substrate. Therefore, the incident infrared ray is absorbed in the infrared absorption layers 24 and 25 and the heat generated is only transported by the heat conduction through the supporting beam line 80 to the substrate side so that the temperature at the detection pixel 20 will increase in strict accordance with the amount of heat converted.

For a pixel connected to a row selected by the vertical addressing circuit 40, the operating point of a pn junction diode within the SOI layer 14 constant-current biased due to the temperature increase is altered and the voltage of the vertical signal line 31 shown in FIG. 1 is, in turn, altered by that alteration of the operating point and read out as a signal voltage. The pn junctions 22 to be connected in series are two in number in the embodiment for the ease of illustration; however, more than two of them can increase the sensitivity accordingly.

Characteristics of this embodiment lie in the construction of the supporting beam line 80 in that it is considerably miniaturized.

The miniature supporting beam line 80 is formed simultaneously with the formation of the gate of the damascene metal gate MOS transistor. Specifically, the U-shaped conducting line 81, the metal-filled core 82, the silicon nitride insulating layer 85 and the bottom insulating layer 86 correspond respectively to the barrier metal, the damascene metal, the sidewall and the gate insulation film of the MOS transistor.

The MOS transistor of a damascene metal is described in detail by A. Yagishita et al. in an article "High Performance Damascene Metal Gate MOSFET's for 0.1 $\mu$m Regime," IEEE Trans. On Electron Devices, Vol. 47, No. 5, p. 1028, May 2000. Also in this embodiment, a similar procedure has been used to form a damascene metal gate and, at the same time, to implement the extremely miniature supporting beam line 80.

Figure 6:
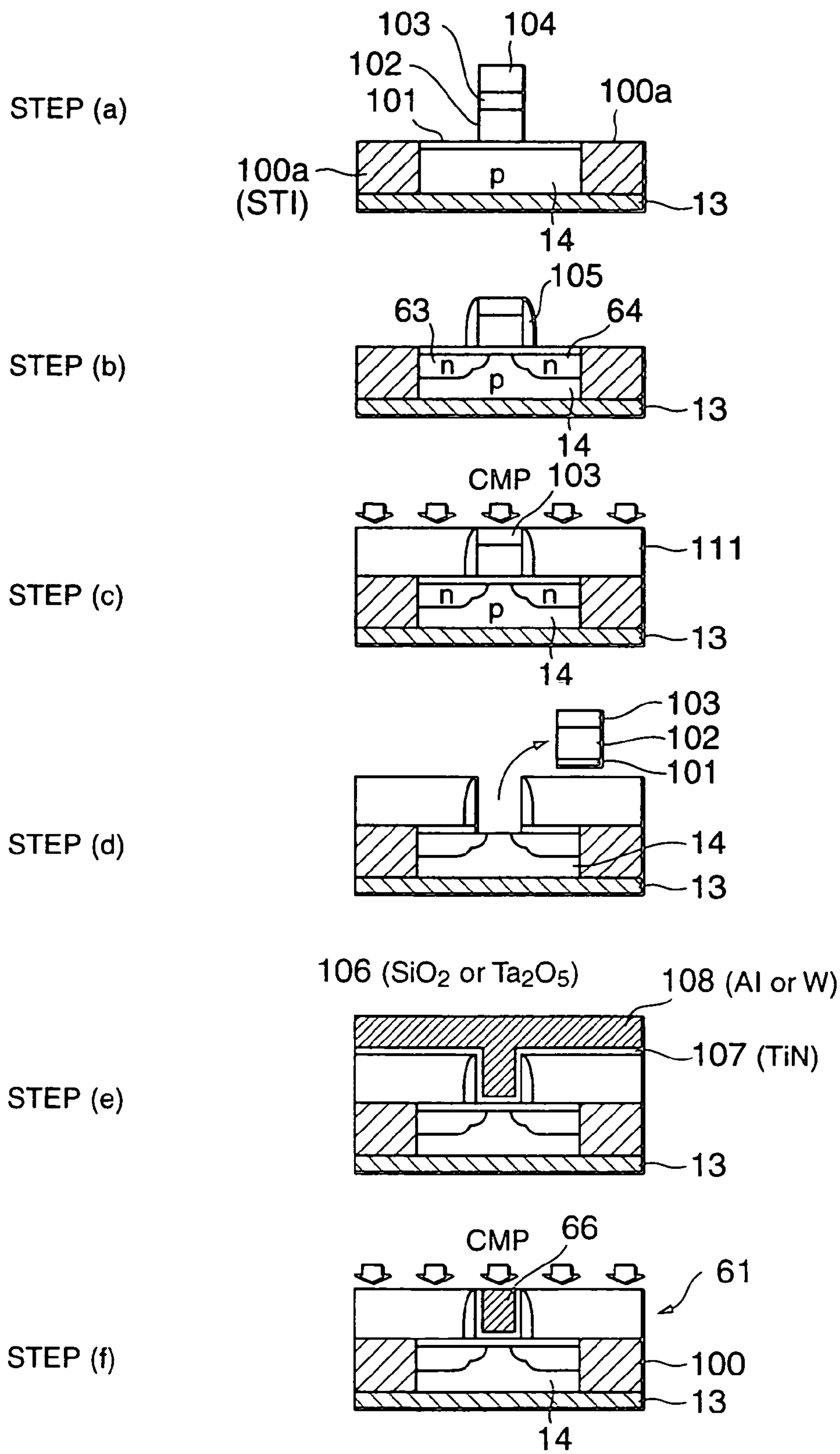
FIG. 6 is a process chart representing the steps for manufacturing a MOS transistor according to the first embodiment of the present invention.
Figure 7:
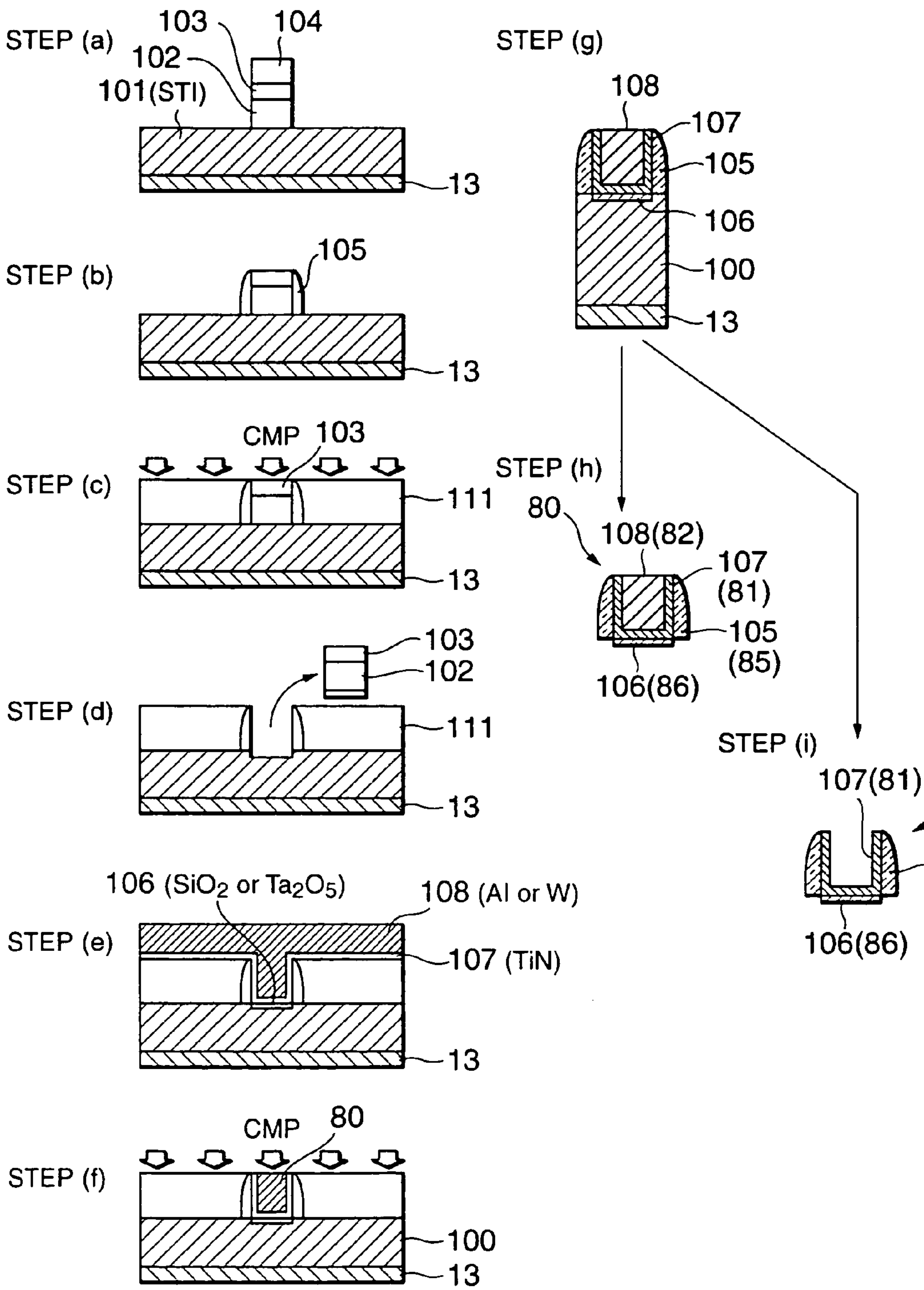
FIG. 7 is a process chart representing the steps for manufacturing the supporting beam line according the first embodiment of the present invention.

The steps for manufacturing a damascene metal gate MOS transistor and the steps to be carried out simultaneously therewith for manufacturing a supporting beam line made of a damascene metal wiring are shown respectively in FIGS. 6 and 7, wherein like reference characters denote like steps in both figures to be carried out simultaneously.

FIG. 6 differs from FIG. 7 with respect to that, in FIG. 6, doped regions 63 and 64 for the source and drain are formed on a p-type semiconductor layer 14 for operating as a transistor and a damascene metal gate 66 is formed on the semiconductor layer 14, since FIG. 6 illustrates the steps for manufacturing a MOS transistor. On the other hand, in FIG. 7, since it illustrates the steps for manufacturing a wiring, it is formed on shallow trench isolation (STI) region 100, an isolation region, and naturally an impurity layer does not have to be formed.

For the simplicity of explanation and the ease of understanding, in FIGS. 6 and 7, the supporting substrate 12 (FIG. 2) has been omitted to illustrate only the embedded silicon oxide insulating layer 13 and the semiconductor layer (SOI) layer 14 thereon for describing the manufacturing steps below.

With regard to Step (a), in FIG. 6, as a well-known LSI manufacturing step, an element isolating insulation region 100*a*, a gate oxide film 101 and a MOS transistor gate have been formed on an SOI layer 14. In FIG. 7, the same step corresponds to formation of a supporting beam line.

At step (a) in FIG. 6 for element isolation, an element isolation region (STI) region 100*a* of a silicon oxide insulating layer is produced by shallow trench isolation (STI) process surrounding a MOS transistor region while at Step (a) in FIG. 7, the whole region is subjected to STI process to form an STI region 100 in which silicon oxide is embedded.

For the MOS gate, a silicon oxide dummy oxide film 101 is first formed and then, as a dummy gate, a polysilicon film 102 and a silicon nitride film 103 thereon are deposited, followed by an etching by reactive ion etching (RIE), etc. using a photoresist 104 as a mask to provide a protrusion.

At Step (b), a lightly doped drain (LDD) doped region is formed by impurity ion implantation in a self-aligned manner to the dummy gate. A sidewall 105 is formed by a general procedure of depositing a silicon nitride film over the whole surface before etching the whole surface by RIE to leave the sidewall. Another ion implantation will form doped regions 63 and 64 for the source and drain in a self-aligned manner to the sidewall 105.

The photoresist 104 used at Step (a) has been eliminated by ashing with oxygen, etc. before forming the sidewall 105 before or after forming the LDD doped regions.

During the formation of the supporting beam line at Step (b) of FIG. 7, the step of forming a doped region is not performed, but the sidewall 105 is formed.

At Step (c), insulation film deposition for the damascene metal process and flattening by chemical mechanical polishing (CMP) are performed.

First of all, as a premetal dielectric (PMD) film 111, a silicon oxide film is deposited by CVD using TEOS as a source and is flattened by CMP.

The sidewall 105 and the dummy gate 103 on the surface side have been formed by a silicon nitride film and, during the process, function as a stopper in CMP.

At Step (d), the dummy gates 103 and 102 as well as the dummy oxide film 101 are sequentially removed. The dummy gate 103 made of silicon nitride is removed by hot phosphoric acid while the dummy gate 102 made of polysilicon and part of the dummy oxide film 101 are removed by chemical dry etching (CDE). In so doing, it is needless to say that the dummy oxide film 101 is determined in thickness and the dummy gate removal is optimized in procedure so that the sidewall 105 made of silicon nitride and the SOI region 14 may not be etched.

Finally, small remaining portion of the dummy oxide film 101 is removed by dilute hydrofluoric acid, for example.

At Step (d) of FIG. 7, the STI region 100 is slightly etched.

At Step (e), a silicon oxide film or a tantalum oxide film is formed as a gate insulation film 106, and a titanium nitride film for example as a barrier metal 107 for preventing diffusion from the damascene metal 108 is deposited by a technique such as sputtering or CVD, before depositing aluminum or tungsten for example as a damascene metal 108 by a depositing technique such as sputtering or CVD and removing the dummy gates 102 and 103 to completely embed the groove formed.

Step (f) flattens and eliminates the barrier metal 107 in the region other than the damascene metal 108 and the gate by CMP to provide a MOS transistor 61 having a damascene metal gate 66 and a basic structure of a supporting beam line 80 having a similar construction as the gate. Steps (g) through (i) after the supporting beam line in FIG. 7 are related to the formation of the hole 16 to be described later.

At Step (g), the PMD layer 111 and the STI layer 100 on both sides as well as the embedded insulating layer 13 are etched by anisotropic etching RIE using the silicon nitride sidewall 105 as a mask.

Further at Step (h), the STI layer 100 and the embedded insulating layer 13 are etched to leave a U-shaped conductor line 81 (barrier metal 107) externally coated with the insulating layer 85 (sidewall 105) and the bottom insulating layer 86 (gate insulation film 106) as well as a metal portion 82 (damascene metal 108) filled within the U-shaped groove. This is to be the supporting beam line 80.

At step (i), during the etching, the damascene metal 108 is etched away to leave structures with U-shaped cross section 81, 85 and 86, which may be obtained as a modification of the supporting beam line 80.

A method of manufacturing an infrared detection pixel is now described with reference to FIG. 2.

The method of manufacturing an infrared detection pixel shown in FIG. 2 will be described below, divided into the process before hole formation and the process of forming a hole.

First at the process before the hole formation, the cross section of the MOS transistor 61 used in the element peripheral circuit in FIG. 2, the infrared detection pixel 20 and the supporting beam line are additionally illustrated. It will be described that the supporting beam line 80 is formed on the SOI layer 14 on the same layer with the gate electrode 66 of the MOS transistor.

First, a so-called SOI substrate is provided as a semiconductor substrate 11 in which an embedded silicon oxide layer 13 and a single crystalline silicon layer (SOI layer) 14 are sequentially laminated on a single crystalline silicon substrate 12.

A shallow trench isolation (STI) process is performed as an example of isolation in a typical LSI manufacturing process. Specifically, isolation regions are partitioned using a technique such as photolithography and the single crystalline silicon layer 14 of the isolation regions is etched away using a technique such as reactive ion etching (RIE), followed by embedding an isolation silicon oxide film 100 by a technique such as chemical vapor deposition (CVD) and flattening by a technique such as chemical mechanical polishing (CMP). During this process, the region for the supporting beam line is defined as an isolation region, in which an isolation silicon oxide film (STI layer) 100 is embedded.

Next, an infrared detection pixel 20 is formed according to the method described above along with the damascene metal gate transistor 61 and the supporting beam line 80 to be used for the peripheral circuit for the addressing circuits 40 and 50, the output portion 60, the constant current source 30, etc. Specifically, the region in the SOI layer 14 where the detection pixels are partitioned is a p-type semiconductor, in which an n-type region is diffused to form multiple pn junctions 22.

Subsequently, an insulating layer 27 is formed on the SOI layer and contact holes are formed by RIE for example and stuffed with plugs 112 if necessary. For example, such plugs 112 may be embedded by depositing a tungsten film on the whole substrate by CVD and then performing CMP. Although not shown, the gate electrode 66 and the supporting beam line 80 are to be formed with contact holes, which are stuffed with plugs 112.

Figure 8A:
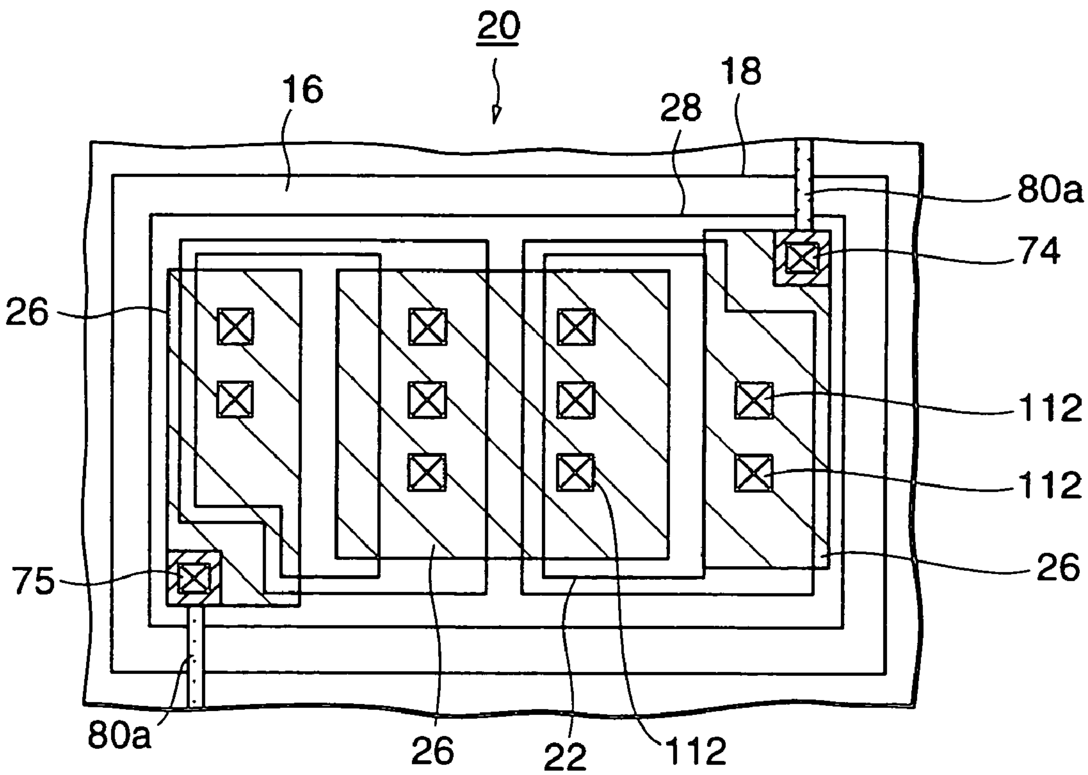
FIG. 8(*a*) is a plan view of an infrared detection pixel according to a second embodiment of the present invention, FIG. 8(*b*) is an enlarged sectional view across a supporting beam line and FIG. 8(*c*) is an enlarged sectional view across a contact portion of the infrared detection pixel.
Figure 8B:
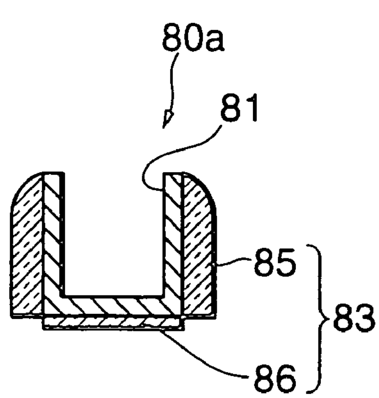
Figure 8C:
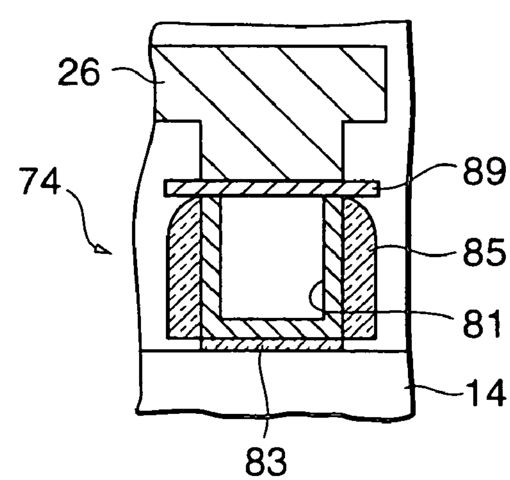

Before depositing the plug material, a barrier metal layer 89 (FIG. 8(*c*)) made of titanium, titanium nitride or a laminated film thereof for example may be formed within the contact hole.

A metal wiring portion 26 to be connected to the plug will then be formed. The wiring is made of aluminum or aluminum alloy for example. After forming the wiring, an infrared absorption layer 23 is formed also serving for passivation of the MOS transistor, etc. In the drawing, a silicon oxide film 24 is laminated with a silicon nitride film 25.

Also, a capacitor 62 to be used in the peripheral circuit is formed by the same process as the damascene metal gate MOS transistor 61 and the supporting beam line 80.

Thus, a MOS capacitor having a construction in which the p-type SOI layer 14 is one of the electrodes with a barrier metal layer formed on the insulating layer 69 and the damascene metal layer 70 is the other electrode is obtained and completely electrically isolated on the SOI substrate.

Since this construction has only one metal layer, it can be made thin and, consequently, the infrared detection portion may be thin when the sensor surface is flattened, enabling to reduce heat capacity of the infrared detection portion and improving the response as well as enabling to reduce image lag.

The process of forming the hole 16 and retaining the infrared detection pixel afloat within the hole will then be discussed.

Since it is necessary to form the hole 16 leaving the pixel 20 for floating retention, the hole 16 is etched by RIE so that the hole has an opening on the side of the SOI layer 14. The etching is performed through the SOI layer 14 and the embedded insulating layer 13 until the single crystalline silicon supporting substrate 12 is exposed.

Figure 14A:
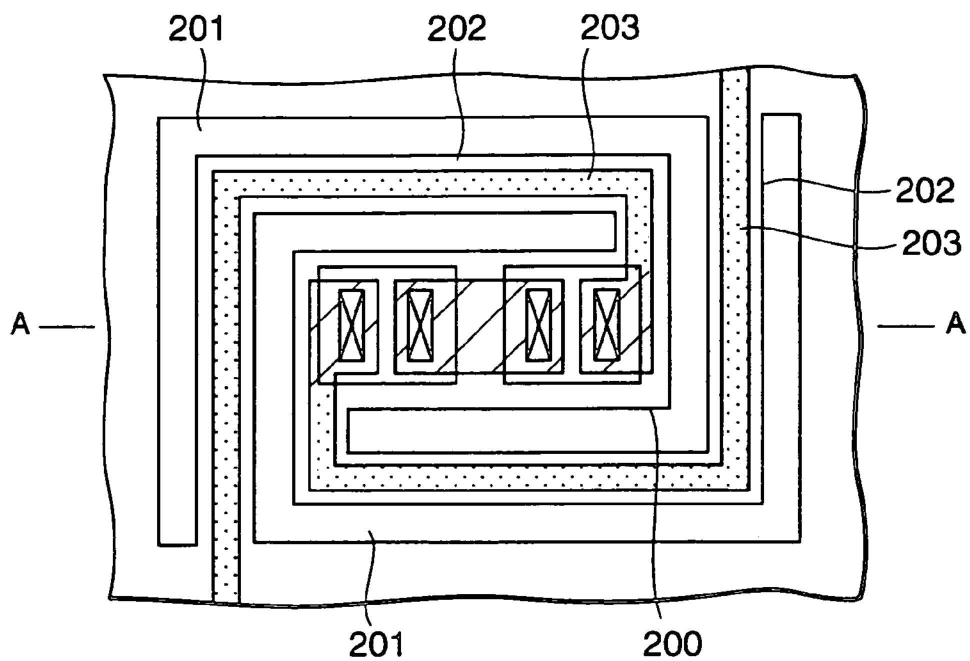
FIG. 14(*a*) is a plan view of an infrared detection pixel in a conventional infrared sensor and FIG. 14(*b*) is a sectional view taken along the line A—A of FIG. 14(*a*).
Figure 14B:
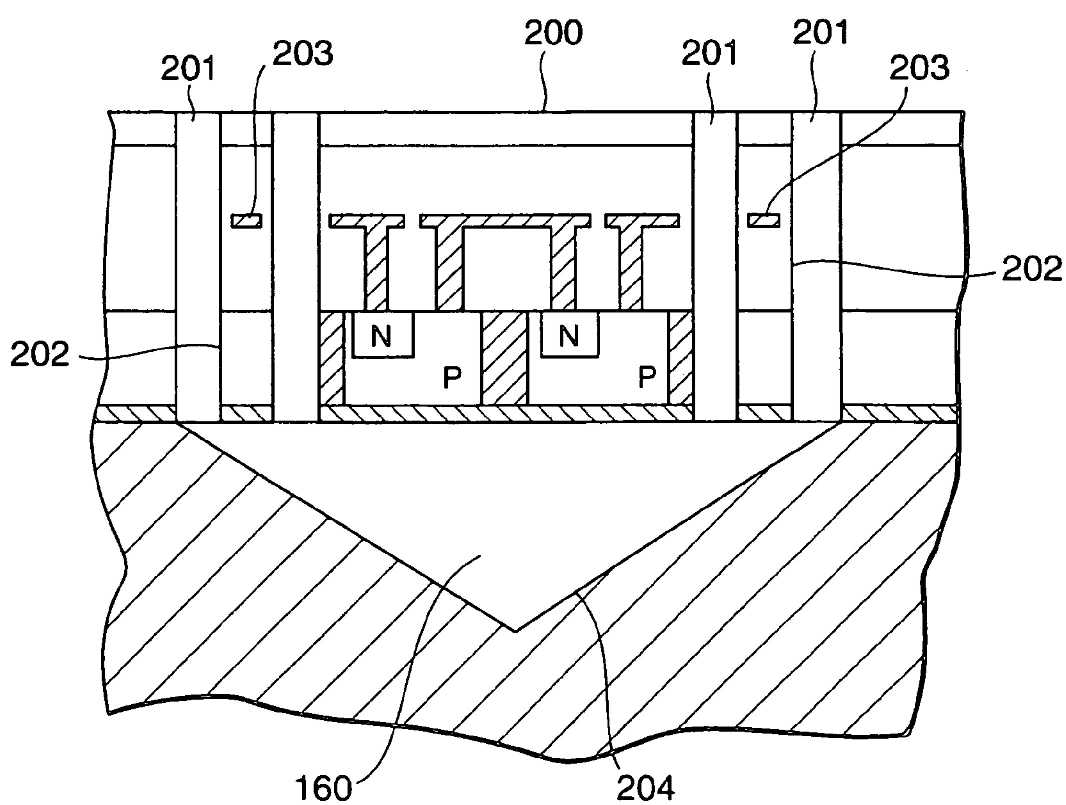

In FIG. 14 shown as a conventional example, the formation of an etched hole 201 is limited in its miniaturization by the limit of lithography, etc. According to the construction of this embodiment, however, a considerable degree of miniaturization is possible, so that the etched hole 16 may be designed to accommodate the supporting beam line 80.

Specifically, a hole for retaining a pixel afloat is formed for each pixel, the hole having an opening of more or less large in size in accordance with the squareness of the pixel. The four sides of the pixel are applied with a photoresist mask having a frame-like opening. The supporting beam line 80 is disposed so that it is located just below the opening of the mask. By means of anisotropic etching, the infrared absorption layers 25 and 24 are etched all the way from the supporting beam line 80 up to the surface of the substrate and then, leaving the supporting beam line 80, the STI region 100 is etched in a self-aligned manner until the supporting substrate 12 is exposed. Step (g) in FIG. 7 is carried out in this process.

Such a construction is possible because the etching resistance of the silicon nitride of the sidewall is high against the etchant for silicon etching of the supporting substrate 12.

Next, silicon anisotropic etching is carried out for forming a cavity 160. Use of a liquid agent such as tetramethyl ammonium hydroxide (TMAH) as an anisotropic etchant for single crystalline silicon to carry out an anisotropic etching of single crystalline silicon scoops out the bottom of the pixel to form the cavity 160 within the single crystalline silicon supporting substrate 12 so that the block-like pixel 20 may be suspended by the supporting beam line 80.

Finally, as shown in Step (h) in FIG. 7, the silicon oxide is etched using an etchant for silicon oxide having a high selectivity with aluminum to eliminate the remaining STI region 100 below the supporting beam line 80.

The width of the supporting beam line 80 is considerably reduced since it can be constructed together with the damascene metal gate of the MOS transistor. For example, when the damascene metal gate is 0.17 micron in length and 0.03 micron in width of the sidewall, the width of the supporting beam line will be 0.23 micron, which can easily be obtained by etching, to provide a linear supporting beam line structure as shown in FIG. 4.

As an etchant then, a liquid mixture of acetic acid and ammonium fluoride having a high selectivity with aluminum may preferably be used.

In addition, when the supporting beam line 80 is designed in a double spiral fashion as in a third embodiment (FIG. 9) for super-high sensitization, it is possible to leave the STI region 100 below the supporting beam line 80 not completely etched. Even in that case, the thermal conductivity of the silicon oxide film which is a material for the STI region is 15 [W/m/K] or so and, considering the relationship with the mechanical strength for supporting the infrared detection portion 20, the design may be optional and optimal depending on its purposes.

The cross sectional area of the supporting beam line is considerably reduced and a considerable degree of sensitization may be possible due to a considerable reduction of heat conduction. According to this construction, it is not only possible to decrease the width of the supporting beam line over the limit of miniaturization made possible by lithography processing, but as well to virtually decrease the heat conduction down to the level predominated only by the supporting beam line. Simultaneously, formation on the same layer as the gate electrode of the MOS transistor enables an extremely fine processing, consequently reducing the heat conduction and allowing for sensitization.

Specifically, using tungsten having a thermal conductivity coefficient of 73 [W/m/K] as a filled metal (damascene metal), titanium nitride having a thermal conductivity coefficient of 21 [W/m/K] as an U-shaped conductor line (barrier metal) and silicon nitride having a thermal conductivity coefficient of 15 [W/m/K] as an outer insulating layer (sidewall), the damascene metal being 0.15 micron in thickness, the barrier metal being 0.01 micron in thickness and the sidewall being 0.03 micron in width at each side, a calculation would gives thermal conductivity of $1.15\times10^{-12}$ [W/m/K]. The thermal conductivity for a typical supporting beam line as shown in FIG. 14 is $1\times10^{-7}$ [W/K], which implies that the length of the supporting beam line according to this embodiment would be as short as 3.2 micron.

As a result, a linear supporting beam line 80 is feasible and, consequently, a fill factor, the area of an infrared detection portion 20 occupied by a pixel, may considerably be improved.

In addition, it is apparent that when the supporting beam line shown in FIG. 4 has a U-shaped construction, its mechanical strength and stability will considerably be improved.

Furthermore, since materials which are low in electric resistance such as aluminum and tungsten are used, thermal noises originating from the electric resistance of the supporting beam line may be suppressed so that sensitization may be allowed for. Also, if a pair of supporting beam lines is unstable for supporting an infrared detection pixel, then three or more supporting beam lines may be provided.

In addition, by using a miniature damascene metal gate MOS transistor for a peripheral circuit, the whole chip area may be reduced and, as a result, reduction of the expense may be effected.

An infrared detection sensor according to a second embodiment of the present invention will then be discussed.

FIGS. 8(*a*), (*b*) and (*c*) illustrate an infrared detection pixel portion according to a second embodiment of the present invention, wherein like reference characters denote like parts as in the first embodiment.

As shown in FIG. 8(*b*) illustrating an enlarged cross section of a supporting beam line 80*a* in relation to the first embodiment shown in FIG. 2, the construction is of Step (i) in FIG. 7, a construction of a supporting beam line 80 from which a damascene metal 108 has been eliminated.

In addition, it is shown on the surface layout of FIG. 8(*a*) that the supporting beam line 80*a* is linearly formed and considerably lessened in length.

Specifically, in this embodiment, because of the elimination of the damascene metal 108 which predominates the heat conduction through the supporting beam line 80*a*, the thermal conductivity per unit length of the supporting beam line 80*a* is further reduced to enable sensitization and simplification of the construction.

The manufacturing method thereof is substantially the same as the first embodiment, basically with the exception of the added process of eliminating the damascene metal 108.

In particular, when aluminum is used as the damascene metal 108, the damascene metal will be etched by a silicon etchant, TMAH, in the process of forming the hole 16 by etching the supporting substrate 6 as shown in Step (i) in FIG. 7, with no additional process required.

As shown in FIG. 8(*c*), however, since there is a cavity inside the U-shaped conductor line of the supporting beam line, additional structures and processes will be required to the supporting beam line for the wiring 26 within the infrared detection pixel, the vertical signal line 31 or the contact portions 74 through 77 of the horizontal select line 41.

Specifically, at the contact portion between the pixel wiring 26 and the supporting beam line 80*a*, it is necessary to cover the whole top surface of the U-shaped portion having no damascene metal with a metal layer 89, which constitutes an additional structure and an additional process.

Using the similar dimensions and parameters as the first embodiment, the thermal conductivity per unit length of the supporting beam line according to this embodiment would considerably be reduced down to $1.6\times10^{-13}$ [W/m/K]. The length of the supporting beam line is even less than that of the first embodiment, allowing to further reduce the heat conduction from the wall of the detection pixel to the surface of the hole.

In the second embodiment, the supporting beam line has no damascene metal so that the U-shaped conductor line may serve as a current path. In this case, considering the mechanical strength, the bottom of the supporting beam line 11 may be left with some STI region. Even in that case, considering the relationship between the sensitivity and the mechanical strength, the design may be optional and optimal depending on its purposes.

Figure 9A:
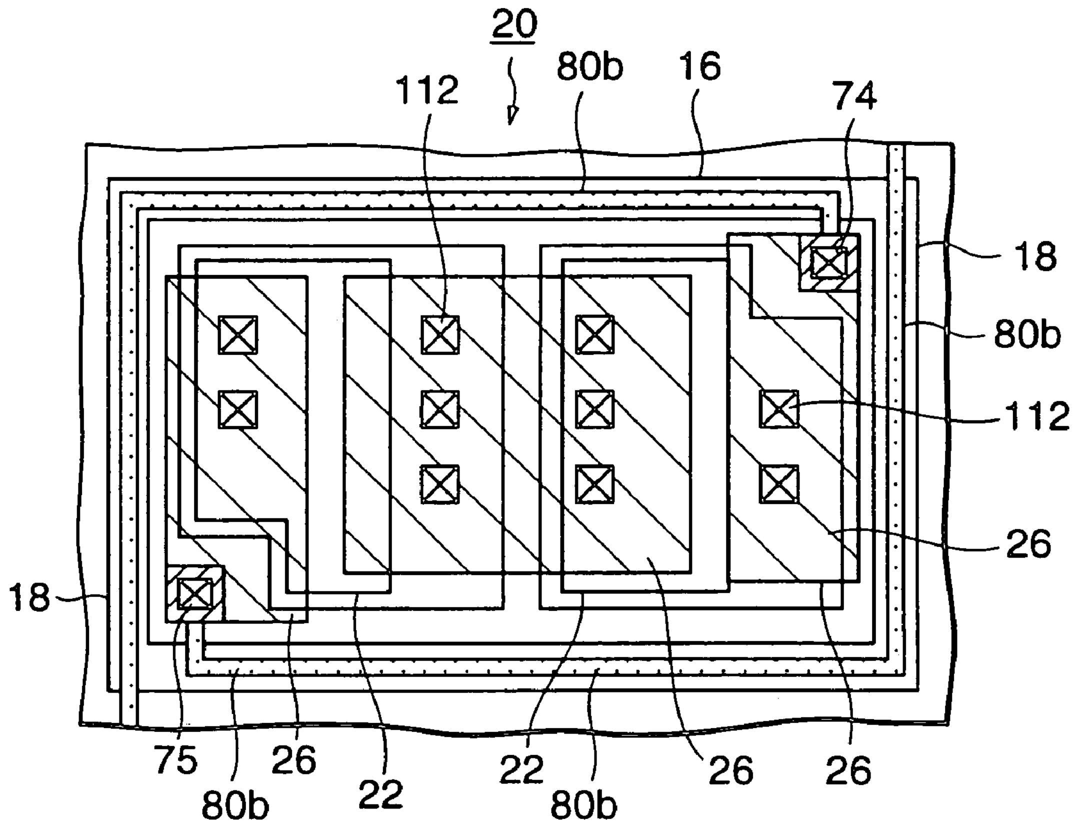
FIG. 9(*a*) is a plan view of an infrared detection pixel according to a third embodiment of the present invention and FIG. 9(*b*) is an enlarged sectional view across a supporting beam line.
Figure 9B:
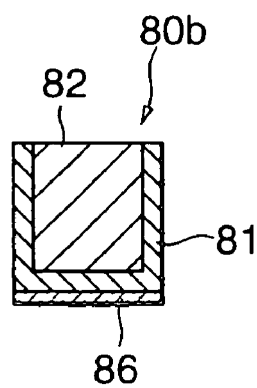

A third embodiment will then be shown in FIG. 9 wherein like reference characters denote like parts as in the first embodiment.

As shown in FIG. 9(*a*), a pair of supporting beam lines 80*b* is connected respectively to the vertical signal line and to the horizontal signal line. Each of these supporting beam lines extends in a double spiral fashion along two sides of the square infrared detection pixel 20 to be connected to the wiring contact portion on the side to the surface 18 of the hole. As shown in FIG. 9(*b*), the supporting beam line 80*b* is not provided with an outer insulating layer (sidewall) and comprises a U-shaped conductor line 81, a bottom insulating layer 86 and a filled metal 82.

The supporting beam line 80*b* having such a spiral pattern can lengthen the heat conduction path and is, therefore, suitable for a sensitive sensor. The metal 82 filled in the U-shaped conductor line contributes to the mechanical strength and the reduction of electric resistance and is suitable for a structure having a spiral pattern.

Figure 10A:
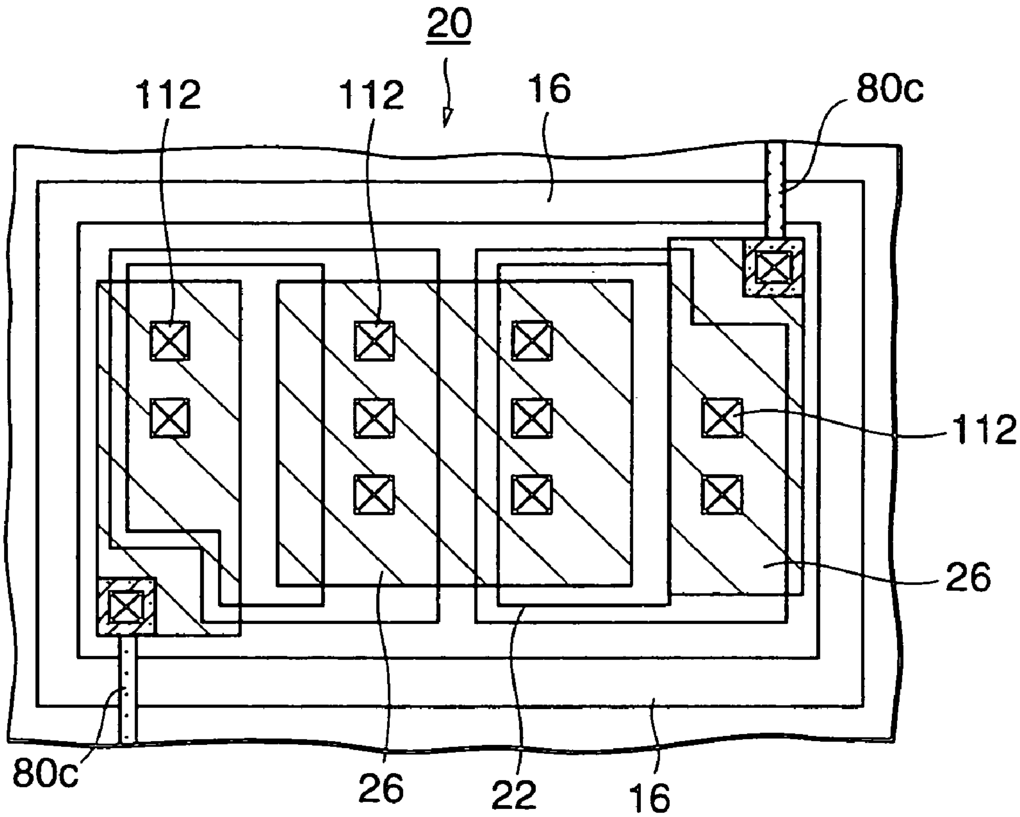
FIG. 10(*a*) is a plan view of an infrared detection pixel according to a fourth embodiment of the present invention, FIG. 10(*b*) is an enlarged sectional view across a supporting beam line and FIG. 10(*c*) is an enlarged sectional view across a contact portion of the infrared detection pixel.
Figure 10B:
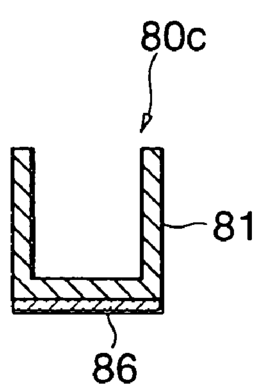
Figure 10C:
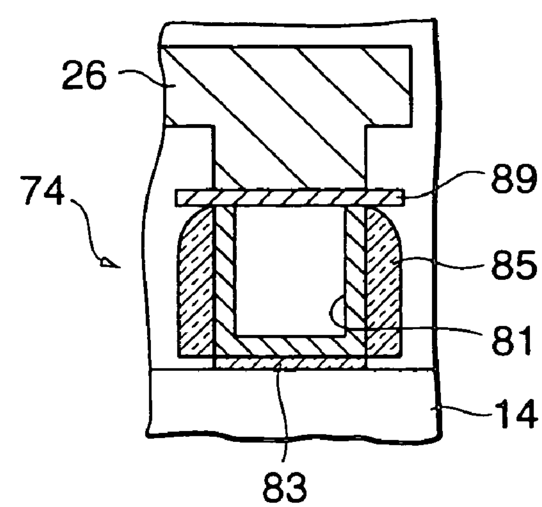

A fourth embodiment will then be shown in FIG. 10, wherein like reference characters denote like parts as in the first embodiment.

A supporting beam line 80*c* comprises a U-shaped conductor layer 84 and a bottom insulating layer 86 disposed at the bottom thereof and extends linearly. No filled metal is provided.

Thus, the third and fourth embodiments have substantially the same construction as the first and second embodiments, but are characterized in that they have no outer insulating layers (sidewalls) 85 on the supporting beam lines 80*b* and 80*c*.

A manufacturing method for obtaining this construction may be carried out only by adjusting the etching conditions for forming the hole 16 respectively in the first and second embodiments, with virtually no additional processes needed.

Specifically, during the etching work for the hole 16, etching conditions in which the selectivity between the silicon oxide film and the silicon nitride film is low can be used to etch the outer insulating layer of the silicon nitride to obtain the constructions in FIGS. 9 and 10.

Using the similar parameters as in the first and second embodiments, the third embodiment would produce substantially the same results as in the first embodiment, whereas the thermal conductivity per unit length of the supporting beam line in the fourth embodiment would appreciably decrease down to $7.3\times10^{-14}$ [W/m/K].

Therefore, if a predetermined characteristic were obtained with a thermal conductivity of $1\times10^{-7}$ [W/K] of the supporting beam line as shown in FIG. 14, then a length of 1.5 micron would be enough for a supporting beam line according to this embodiment, enabling a reduction of the length down to about 1/50 of the length of the structure in FIG. 14.

As a result, the supporting beam line 80*c* serving also as a supporting leg as shown in the fourth embodiment can be implemented linearly, thereby considerably improving a fill factor, the ratio of the area of the infrared detection portion 20 occupied by the pixel. The aforementioned effect of optical sensitization may thereby be obtained as well.

In addition, since the supporting beam line according to the fourth embodiment has a linear pattern, its mechanical strength and stability will considerably be improved as well analogously to the first and second embodiments.

Conversely, if the supporting beam line according to this embodiment were applied to the supporting structure which has a spiral pattern, then its sensitivity would approximately be fifty times as high.

It is of course possible also in this case to leave the STI region 100 at the bottom of the supporting beam line 80*c* as shown in FIG. 7(*g*), with an increased heat conduction. Considering the relationship between the sensitivity and the mechanical strength, however, the design may be optional and optimal depending on its purposes.

A fifth embodiment of the present invention will then be described with reference to FIG. 11, wherein like reference characters denote like parts as in the first embodiment.

Figure 11A:
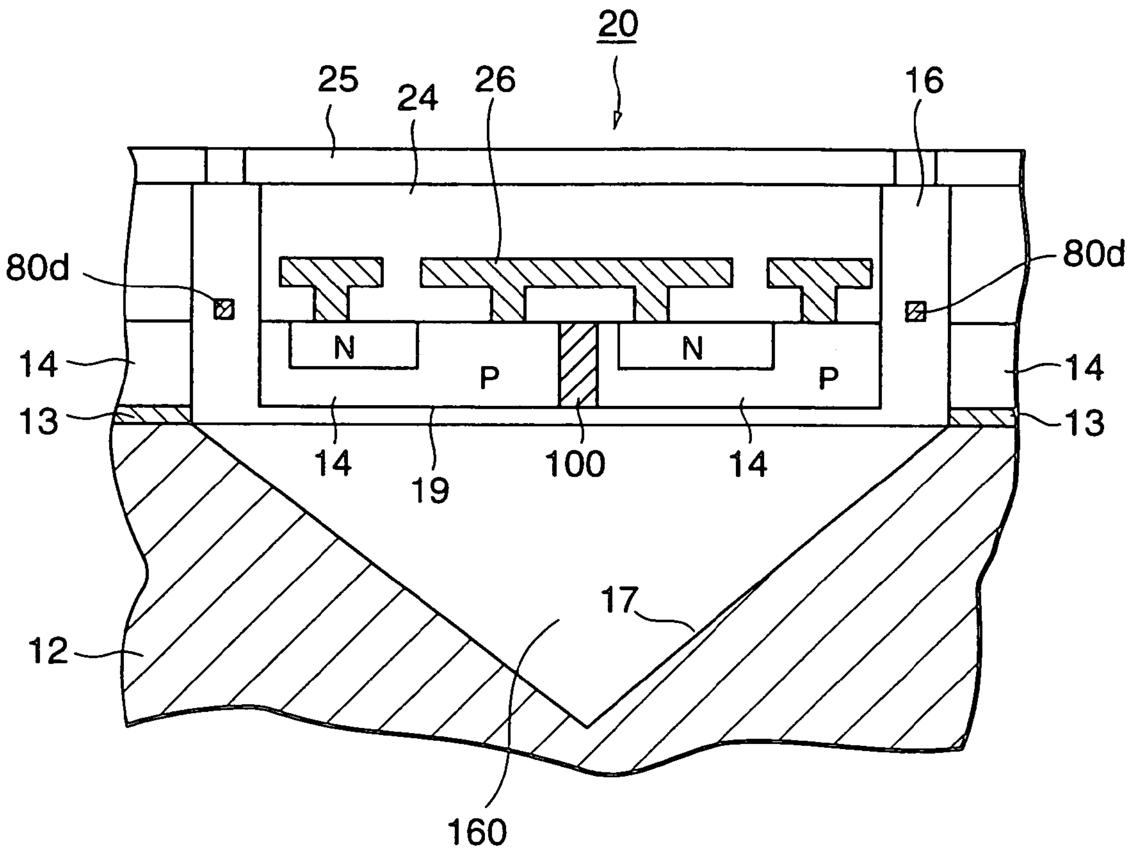
FIG. 11(*a*) is a plan view of an infrared detection pixel according to a fifth embodiment of the present invention and FIG. 11(*b*) is an enlarged sectional view across a supporting beam line.
Figure 11B:
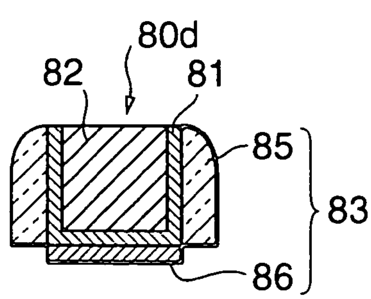

As seen in FIG. 11(*a*), there is no embedded oxide film 13 of an SOI substrate at the bottom of an infrared detection pixel 20 and, instead, the bottom surface 19 of the SOI layer 14 of the pixel is exposed and directly opposing to the surface 17 of the hole. Apart from the above, this embodiment has the same construction as in the first embodiment. Furthermore, a supporting beam line 80*d* has the same construction as in the first embodiment as shown in FIG. 11(*b*).

Each process for implementing the construction according to the fifth embodiment is basically the same as each of those in the first embodiment. The only difference is the elimination of the embedded oxide film layer 13, which is enabled by increasing the period of time for etching the silicon oxide of the STI region 100 at the bottom of the supporting beam line 80*d* (Step (g) in FIG. 7) after etching the supporting substrate 11.

According to this construction, the heat transportation by emission from the back face 19 of the pixel 20 is suppressed so that the limit of sensitization associated with the miniaturization of the supporting beam line may be shifted upward.

The reason is as follows.

According to the conventional construction of FIG. 14 and the constructions of the first through fourth embodiments, the bottom of the infrared detection pixel is provided with a silicon oxide film 13 which is an embedded insulating layer. Incidentally, as already stated, the silicon oxide film exhibits an absorption at 10 μm band arising from the presence of an Si—O bond, as shown in FIGS. 5(*b*) and 5(*c*). It particularly means that the emissivity at 10 μm band is high, suggesting that the temperature of the pixel 20 raised by an incident infrared ray will be lowered by the heat transportation through the emission from the silicon oxide film at the bottom.

Due to the miniaturization of the supporting structure, the heat conductance of the supporting structure has been realized at a value of $10^{-7}$ [W/m/K] or so. However, according to the present invention, when the heat conductance becomes $10^{-8}$ [W/m/K] or so, the heat transportation by the emission from the back face described above will predominate, bringing about the limit of sensitization.

To cope with this, according to the fifth embodiment, the most of the back face of the sensor portion 19 has the exposed SOI layer 14 of single crystalline silicon. Since single crystalline silicon contains very little impurity, it does not exhibit a peak of infrared absorption arising from the Si—O bond and, therefore, has an extremely low emissivity.

Specifically, according to this embodiment, the limit of sensitization in a trend of miniaturizing a supporting beam line can further be raised.

In this embodiment, the supporting beam line may have the construction according to any of FIGS. 8 through 10.

Though each of the embodiments having so far been described relates to an infrared sensor device comprising multiple infrared detection elements arranged in a matrix in a two-dimensional manner, it may also be applied to a one-dimensional sensor comprising infrared detection elements arranged in a one-dimension manner or a single infrared sensor not arranged in any array or matrix, with the similar effects obtained.

Figure 12:
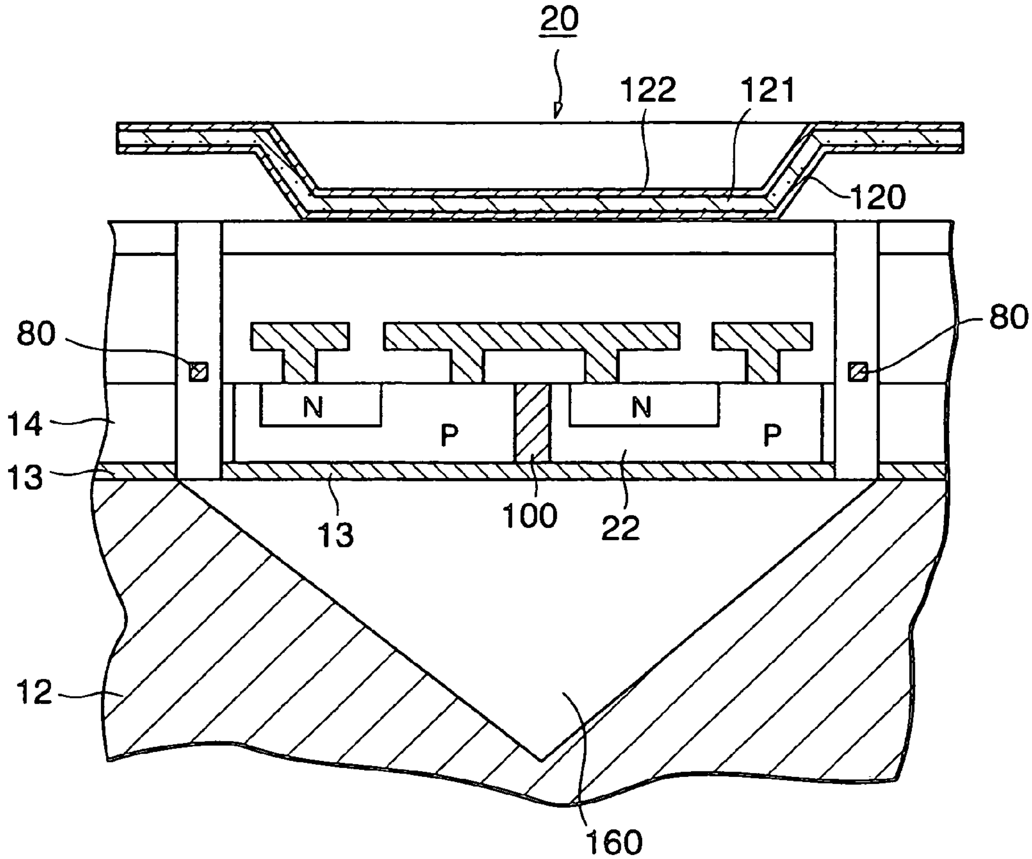
FIG. 12 is a sectional view across an infrared detection pixel according to a modification of the present invention.

Also encompassed is, as shown in FIG. 12, a modification of the present invention in which an infrared absorption layer 23*a* is formed on an infrared detection pixel 20 as an umbrella-shaped body having an area larger than the pixel. This umbrella-like absorption layer 122 is laminated with a reflective layer 120 as a ground and an insulating layer 121 as an intermediate, for example. In this manner, providing a larger area will improve the fill factor of the pixel 20.

Figure 13:
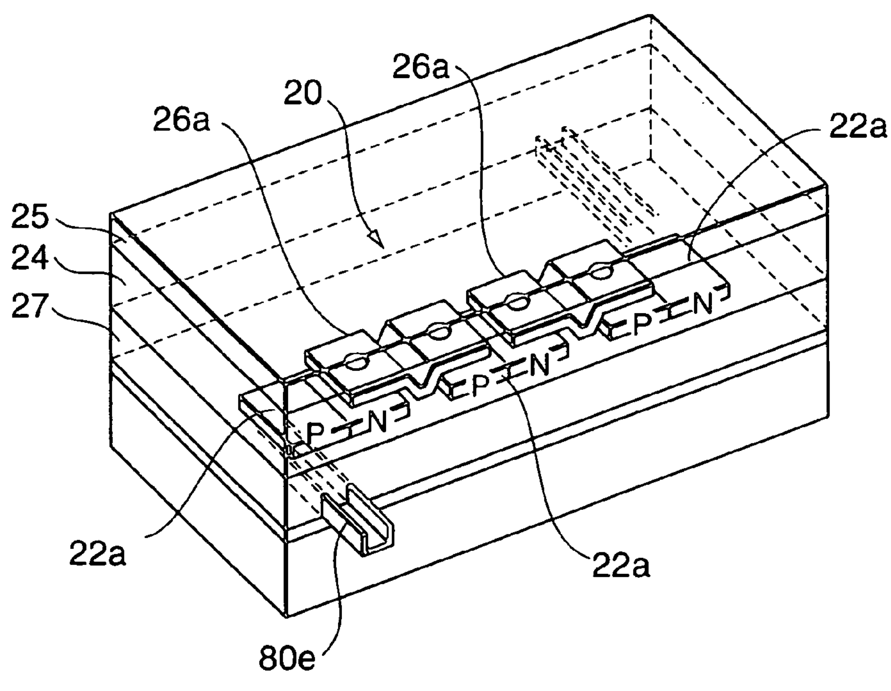
FIG. 13 is a perspective view of an infrared detection pixel according to another modification of the present invention.

Also, the supporting beam line 80*e* according to each of the embodiments of the present invention is applicable to an infrared detection pixel which is used for a thermoelectric conversion portion as shown in FIG. 13 in which pn junctions 22*a* of a lateral construction are connected in series by wirings 26*a*.

Furthermore, the present invention is not limited to an infrared detection portion which employs pn junctions for thermoelectric conversion means and, on the contrary, may be used for an infrared detection portion which uses a bolometer, etc. as thermoelectric conversion means to provide for fine processability as well as sensitization and cost reduction due to the effect of shortening the processing.

According to the present invention, therefore, a highly sensitive and inexpensive uncooled infrared sensor can be obtained.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An infrared sensor device comprising:

a semiconductor substrate having a principal plane including a plurality of surface portions in each of which a hole is provided;

a plurality of infrared detection pixels each disposed in one hole, each comprising, an infrared absorption portion configured to absorb an infrared ray and to convert the infrared ray into heat, and a thermoelectric conversion portion configured to convert the heat into an electric signal;

a semiconductor peripheral circuit disposed on the principal plane of the substrate and configured to read out the electric signals from the infrared detection pixels, the semiconductor peripheral circuit including at least a MOS transistor having a gate comprising a first electric conductor with U-shaped cross section along directions of a source and drain and a metal filled within the electric conductor; and a plurality of supporting beam lines, each extending across the infrared detection pixel and the surface portion having the hole, configured to support the infrared detection pixel afloat within the hole and configured to electrically connect the infrared detection pixels to the semiconductor peripheral circuit, each of the supporting beam lines including at least a second electric conductor with U-shaped cross section and formed in a same layer as the first electric conductor with U-shaped cross section of the gate of the MOS transistor.

2. An infrared sensor device according to claim 1 wherein the supporting beam line is linear.

3. An infrared sensor device according to claim 1 wherein the thermoelectric conversion portion of the infrared detection pixel has a pn junction.

4. An infrared sensor device according to claim 1 wherein the infrared absorption portion comprises a silicon oxide film and a silicon nitride film laminated thereon.

5. An infrared sensor device according to claim 1 wherein the semiconductor substrate and the thermoelectric conversion portion of the infrared detection pixel are made of single crystalline silicon and the bottom surface of the hole in the semiconductor substrate is directly opposed to the bottom surface of the thermoelectric conversion portion.

6. An infrared sensor device comprising:

a semiconductor substrate having a semiconductor supporting substrate and a semiconductor layer and an insulating layer interposed therebetween, in which a plurality of holes are provided in the semiconductor substrate, the holes penetrating the semiconductor layer and the insulating layer to reach the semiconductor supporting substrate;

a plurality of infrared detection pixels each disposed in a respective one of the holes, each pixel comprising an infrared absorption portion configured to absorb an infrared ray and to convert the infrared ray into heat and a thermoelectric conversion portion configured to convert the heat into an electric signal;

a semiconductor peripheral circuit, formed on the semiconductor layer, the semiconductor peripheral circuit including at least a MOS transistor having a damascene metal gate configured to drive the infrared detection pixels to read out the electric signal; and damascene metal supporting beam lines extending across side surfaces of a respective one of the holes of the semiconductor substrate to a respective one of the infrared detection pixels, configured to support the respective infrared detection pixel afloat within the respective hole and to electrically connect the respective infrared detection pixel to the semiconductor peripheral circuit, the damascene metal supporting beam lines disposed in a same layer as the damascene metal gate.

7. An infrared sensor device according to claim 6 wherein the semiconductor peripheral circuit includes a MOS capacitor formed on the semiconductor layer, an electrode of the MOS capacitor disposed in the same layer as the damascene metal gate of the MOS transistor.

8. An infrared sensor device comprising:

a semiconductor substrate having a semiconductor supporting substrate and a semiconductor layer and an insulating layer interposed therebetween, in which a plurality of holes are provided in the semiconductor substrate, the holes penetrating the semiconductor layer and the insulating layer to reach the semiconductor supporting substrate;

a plurality of infrared detection pixels each disposed in one of the holes, each pixel comprising an infrared absorption portion configured to absorb an infrared ray and to convert the infrared ray into heat and a thermoelectric conversion portion configured to convert the heat into an electric signal, the plurality of infrared detection pixels arranged in a matrix and connected by horizontal and vertical wirings;

a semiconductor peripheral circuit comprising a pixel selecting circuit, formed on the semiconductor layer and connected to the horizontal wirings, configured to select the infrared detection pixel from which the signal is to be read, a pixel signal reading circuit, connected to the vertical wirings, configured to read out the signal from the infrared detection pixel selected by the pixel selecting circuit and an outputting circuit configured to output the signal read out by the reading circuit and also including a MOS transistor having a damascene metal gate; and damascene metal supporting beam lines extending across side surfaces of a respective one of the holes of the semiconductor substrate to a respective one of the infrared detection pixels, configured to support the respective infrared detection pixel afloat within the respective hole and to connect the respective infrared detection pixel to the horizontal and vertical wirings, the damascene metal supporting beam lines disposed in a same layer as the damascene metal gate.

9. An infrared sensor device according to claim 8 wherein each of the supporting beam lines is disposed below the horizontal and vertical wirings.

* * * * *